United States Patent
Okawa et al.

(10) Patent No.: US 8,513,898 B2
(45) Date of Patent: Aug. 20, 2013

(54) LIGHT EMITTING DEVICE THAT RESTORES ABNORMAL LIGHT EMITTING ELEMENT

(75) Inventors: Masanao Okawa, Nara (JP); Hirofumi Takaki, Aichi (JP); Shin Ukegawa, Kyoto (JP); Minoru Maehara, Osaka (JP); Hirofumi Konishi, Osaka (JP)

(73) Assignee: Panasonic Corporation, Osaka (JP)

( * ) Notice: Subject to any disclaimer, the term of this patent is extended or adjusted under 35 U.S.C. 154(b) by 304 days.

(21) Appl. No.: 12/934,720

(22) PCT Filed: Mar. 26, 2009

(86) PCT No.: PCT/JP2009/056195
§ 371 (c)(1),
(2), (4) Date: Jan. 13, 2011

(87) PCT Pub. No.: WO2009/119773
PCT Pub. Date: Oct. 1, 2009

(65) Prior Publication Data
US 2011/0101875 A1 May 5, 2011

(30) Foreign Application Priority Data
Mar. 26, 2008 (JP) ................................ P2008-080241

(51) Int. Cl.
*G05F 1/00* (2006.01)
(52) U.S. Cl.
USPC ........... 315/291; 315/307; 315/360; 315/294; 315/224; 315/209 R; 315/312; 345/46; 345/52; 345/84; 345/212; 345/204
(58) Field of Classification Search
USPC .................. 315/291, 294, 297, 307, 312, 224, 315/247, 209 R, 185 R; 345/46, 82, 84, 204, 345/212
See application file for complete search history.

(56) References Cited

U.S. PATENT DOCUMENTS

| | | | | |
|---|---|---|---|---|
| 6,839,056 B2 * | 1/2005 | Nagai et al. | ................... | 345/204 |
| 7,088,319 B2 * | 8/2006 | Yoshida et al. | ................. | 345/82 |
| 7,528,553 B2 * | 5/2009 | Ito et al. | ........................ | 315/291 |
| 7,911,463 B2 * | 3/2011 | Lin et al. | ........................ | 345/212 |
| 8,138,679 B2 * | 3/2012 | Konishi et al. | ............ | 315/185 R |
| 2004/0032380 A1 | 2/2004 | Kanauchi | | |

FOREIGN PATENT DOCUMENTS

| | | |
|---|---|---|
| EP | 1 094 438 | 4/2001 |
| JP | 03-110786 | 5/1991 |
| JP | 2000-348861 | 12/2000 |
| JP | 2001-117534 | 4/2001 |
| JP | 2003-229262 | 8/2003 |
| JP | 2003-234187 | 8/2003 |
| JP | 2004-70057 | 3/2004 |
| JP | 2005-078828 | 3/2005 |
| JP | 2007-042492 | 2/2007 |
| JP | 2007-149463 | 6/2007 |
| JP | 2007-200662 | 8/2007 |
| JP | 2007-207703 | 8/2007 |

* cited by examiner

*Primary Examiner* — Haiss Philogene
(74) *Attorney, Agent, or Firm* — Greenblum & Bernstein, P.L.C.

(57) ABSTRACT

A light emitting device includes: a plurality of light emitting elements configured to emit light when a direct current is supplied thereto; and a direct current power supply circuit configured to supply an electric current of a given level or more to the light emitting elements. The light emitting device further includes: a light emitting element voltage detection circuit configured to detect a voltage applied to the light emitting elements; and a forward/reverse inverting circuit configured, when the light emitting element voltage detection circuit detects an abnormality in a light emitting element, to apply a reverse voltage to the light emitting element in which the abnormality is detected.

6 Claims, 8 Drawing Sheets

LIGHT EMITTING DEVICE THAT RESTORES ABNORMAL LIGHT EMITTING ELEMENT

TECHNICAL FIELD

The present invention relates to a light emitting device, and more particularly, to a light emitting device capable of applying reverse voltage to an abnormal light emitting element reliably such that a refresh current flows in the abnormal light emitting element, thereby restoring the abnormal light emitting element and also avoiding stress on a normal light emitting element.

BACKGROUND

An organic electroluminescent device is a light emitting device using a phenomenon in which emission of light is generated by excitons formed by recombination of electrons and holes injected into an organic substance. In recent years, development of a display using the organic electroluminescent device increases. This is because the organic electroluminescent device can provide a wider viewing angle, faster response speed, and higher contrast than does a liquid crystal display.

In general, the organic electroluminescent device has a structure in which an organic layer is sandwiched between a cathode and an anode. When a voltage is applied to the organic electroluminescent device, an electron is injected as a carrier from the cathode, and a hole is injected as a carrier from the anode. When the carriers recombine together in the organic layer, an exciton is formed, thereby emitting light.

Generally, the organic electroluminescent device includes: an organic layer including a light emitting layer, a hole transporting layer, an electron transporting layer, etc.; and a pair of electrodes (a cathode and an anode) which opposes each other through the organic layer. Usually, the organic layer usually has a very small thickness, for example, in the order of 100 nm. Therefore, a leakage failure between electrodes or a failure in dielectric strength between electrodes may occur due to contamination by fine foreign matters, extraneous on the organic layer, etc.

If such a failure occurs, a black dot, a dark line, or a black line may be observed when the organic electroluminescent device is activated, thereby deteriorating a display quality of the organic luminescent device. Even when a black dot, or the like, does not occur, a leakage current may occur in an area with an insufficient dielectric strength, during activation of the organic electroluminescent device. In particular, the size of the organic electroluminescent device recently increases, and a probability of such failures tends to increase, which is a great problem.

In light of such circumstances, there is a known method for restoring an insufficient insulation area between a pair of electrodes in an organic electroluminescent device including a plurality of types of organic layers which include a plurality of light emitting layers that emit different colors of light, and a pair of electrodes opposing each other through the plurality of types of organic layers. According to the method, a reverse bias voltage is applied to the plurality of types of organic layers under application conditions which vary by color of light emission, whereby isolating the insufficient insulation area between the pair of electrodes. Accordingly, the insufficient insulation area is restored (see, for example, Patent Document 1).

There is another known method for manufacturing an organic electroluminescent element including a layered body formed by sequentially stacking, on a substrate, an anode, an organic layer including a light emitting layer, and a cathode. The method includes: a process of forming the cathode by sequentially laying a first conductive layer, a buffer layer, and a second conductive layer; and a process of subjecting the formed layered body to aging.

In the method, the cathode is formed by sequentially stacking the first conductive layer, the buffer layer, and the second conductive layer. Further, after formation of the layered body, the body is subjected to aging. Accordingly, it is possible to manufacture an organic electronic luminescent element that requires a drive voltage which is lower than that of the related-art organic electroluminescent element (see, for example, Patent Document 2).

There is a proposed lighting apparatus including direct current power supply means for supplying a desired direct current voltage to an organic electroluminescent element; detection means for detecting shutoff of the voltage supplied from the direct current power supply means; and reverse voltage supply means for supplying a voltage of a reverse characteristic to the organic electroluminescent element when the voltage supplied from the direct current power supply means is shut off (Patent Document 3).

Patent Document 1: JP-A-2007-207703
Patent Document 2: JP-A-2007-200662
Patent Document 3: JP-A-2007-149463

DISCLOSURE OF THE INVENTION

Problems to be Solved by the Invention

In the method for restoring the organic electroluminescent element described in Patent document 1, when the organic electroluminescent element indicates an abnormal voltage, a forward/reverse inverting circuit is activated to perform refreshing. Even when a reverse voltage is applied to the organic electroluminescent element, no electric current flows in normal organic electroluminescent elements. Accordingly, normal organic electroluminescent elements have to be turned off so as to provide a time period for the refreshing individually.

In Patent Document 3, a voltage of reverse characteristic is supplied to the organic electroluminescent element when shutoff of the voltage supply from the direct current power supply means is detected. Therefore, even in this case, it is necessary to provide a dedicated time period for the refreshing.

When a reverse voltage is applied to an electroluminescent element that does not need the refreshing, the electroluminescent element cannot be illuminated, and further, stress is applied on the electroluminescent element.

In the light emitting device including a plurality of light emitting elements, such as electroluminescent elements, configured to emit light when a direct current is supplied, when a light emitting element shows an abnormality and when the forward/reverse inverting circuit is activated to apply a reverse voltage to the abnormal light emitting element to refresh the abnormal element, an electric current does not flow in normal light emitting elements. Therefore, refresh of the light emitting elements cannot be performed.

The present invention was made in light of the circumstances, and an object thereof is to provide a light emitting device capable of applying refresh current to an abnormal light emitting element reliably, thereby restoring the abnormal light emitting element and also avoiding stress on a normal light emitting element.

Means for Solving the Problems

In the present invention, a light emitting device comprises: one or more light emitting elements configured to emit light when a direct current is supplied thereto; a direct current power supply circuit configured to supply an electric current of a given level or more to the one or more light emitting elements; a light emitting element voltage detection circuit configured to detect a voltage applied to the one or more light emitting elements; and a forward/reverse inverting circuit configured, when the light emitting element voltage detection circuit detects an abnormality in a light emitting element, to apply a reverse voltage to the light emitting element in which the abnormality is detected.

The configuration includes the forward/reverse inverting circuit allocated to the one or more light emitting elements and the light emitting element voltage detection circuit configured to detect a voltage applied to the one or more light emitting elements. Therefore, an abnormal light emitting element can be detected, and the abnormal light emitting element can be restored by applying a reverse voltage to the abnormal light emitting element reliably. Accordingly, a refresh current can flow in the abnormal light emitting element.

In the light emitting device of the present invention, the forward/reverse inverting circuit includes a shorting switch configured to short a normal light emitting element when the reverse voltage is applied to the light emitting element in which the abnormality is detected.

The configuration includes the forward/reverse inverting circuit allocated to the one or more light emitting elements and the shorting switch provided for the individual light emitting element. Therefore, the reverse voltage can reliably be applied to the abnormal light emitting element, whereas application of the reverse voltage to the normal light emitting element can be avoided. The abnormal light emitting element can be restored, and stress to the normal light emitting element can be avoided.

In the light emitting device of the present invention, the plurality of light emitting elements are connected in series, the shorting switches are connected in parallel with the plurality of light emitting elements, respectively, and the light emitting element voltage detection circuit detects a voltage applied to each of the plurality of light emitting elements and detects an abnormality in the light emitting element based on a change in a value of the voltage.

In the configuration, when the abnormality in the light emitting element is detected, the abnormality can be detected based on only a change in the value of voltage across the light emitting element. Accordingly, the number of components and the number of objects to be controlled can be reduced.

In the light emitting device of the present invention, the shorting switches are field effect transistors.

In the configuration, high speed operation of the field effect transistors can avoid application of the reverse voltage to the normal emitting element. Also, stress to the normal light emitting elements can be avoided.

In the light emitting device of the present invention, the shorting switches are thyristors.

In the configuration, when the reverse voltage is applied to the light emitting elements, the thyristors automatically conduct, thereby protecting the light emitting elements. Therefore, it is not necessary to provide drive ICs for activating the thyristors, and the configuration of the light emitting device can be simplified.

In the light emitting device of the present invention, the forward/reverse inverting circuit includes a light emitting element current detection circuit configured to detect an electric current flowing in the light emitting elements.

In the configuration, when an abnormality in the light emitting element is detected, an abnormality can be detected based on only a change in a value of the electric current flowing in the one or more light emitting elements, and hence the number of components and the number of objects to be controlled can be reduced.

In the light emitting device of the present invention, the forward/reverse inverting circuit includes: first and second switching elements which are connected in series to a power supply and a series connection point of which is connected to one end of the one or more light emitting elements; and third and fourth switching elements which are connected in series to the power supply and a series connection point of which is connected to the other end of the one or more light emitting elements, wherein the second and third switching elements are turned on such that a reverse voltage is applied to the light emitting element in which the abnormality is detected so as to refresh the abnormal light emitting element, and wherein the first and fourth switching elements are turned on such that a forward voltage is applied to the refreshed light emitting element.

In the configuration, the reverse voltage is applied to the light emitting element, whereby the light emitting element can be refreshed so that the abnormal light emitting element can be restored. Accordingly, the life of the light emitting element is prolonged.

In the light emitting device of the present invention, the light emitting element voltage detection circuit determines, based on a change in the voltage of the one or more light emitting elements, that the abnormal light emitting element is restored to a normality, and the forward/reverse inverting circuit applies a forward voltage to the light emitting element restored to the normality.

In the configuration, when the abnormal light emitting element is restored to the normality, the light emitting element can again emit light. Therefore, the life of the light emitting element can be prolonged. Further, the abnormality can be detected based on only a change in the value of the voltage flowing in the light emitting element, and hence the number of components and the number of objects to be controlled can be reduced.

In the light emitting device of the present invention, the light emitting element current detection circuit determines, based on a change in the electric current of the one or more light emitting elements, that the abnormal light emitting element is restored to a normality, and the forward/reverse inverting circuit applies a forward voltage to the light emitting element restored to the normality.

In the configuration, when the abnormal light emitting element is restored to the normality, the light emitting element can again emit light. Therefore, the life of the light emitting element can be prolonged. Further, the abnormality can be detected based on only a change in the value of the electric current flowing in the light emitting element, and hence the number of components and the number of objects to be controlled can be reduced.

A lighting apparatus of the present invention comprises the light emitting device including a plurality of light emitting elements containing one or more organic electroluminescent elements.

In the configuration, the reverse voltage is reliably applied to the abnormal light emitting element so as to apply a refresh current flow to the light emitting element, thereby restoring the abnormal light emitting element, and avoiding stress on the normal light emitting elements.

Advantages of the Invention

As described above, the light emitting device of the present invention includes a forward/reverse inverting circuit allocated to light emitting elements and a light emitting element voltage detection circuit configured to detect a voltage applied to the light emitting elements. Therefore, an abnormality in the light emitting element can be detected, and a reverse voltage can reliably be applied to the abnormal light emitting element. A refresh current flows the abnormal light emitting element, thereby enabling restoration of the abnormal light emitting element. Further, infliction of stress to normal light emitting elements can be avoided.

DESCRIPTION OF REFERENCE SYMBOLS

1 AC POWER SUPPLY
2 PFC CIRCUIT
3 PFC CONTROL CIRCUIT
4 STEP-DOWN CHOPPER CIRCUIT
5 STEP-DOWN CHOPPER CONTROL CIRCUIT
6 FORWARD/REVERSE INVERTING CIRCUIT
7 LIGHT EMITTING ELEMENT VOLTAGE-CURRENT CONTROL CIRCUIT
8, 8a, 8b, 8c, 32 LIGHT EMITTING ELEMENT
9a, 9b, 9c ABNORMAL SHORT CIRCUIT
11 LIGHT EMITTING ELEMENT CURRENT DETECTION CIRCUIT
12 LIGHT EMITTING ELEMENT VOLTAGE DETECTION CIRCUIT
13, 14, 15 DRIVE IC
16 MICROCOMPUTER
21 LIGHT EMITTING SURFACE
22 CASING
23 ELECTRONIC COMPONENT
24 PRINTED BOARD
25 UPPER SURFACE OF CASING
26 LOWER SURFACE OF CASING
27, 31 GLASS
28 ITO
29 ORGANIC LIGHT EMITTING LAYER
30 ALUMINUM ELECTRODE
100 LIGHT EMITTING DEVICE
200 LIGHTING APPARATUS

BEST MODE FOR CARRYING OUT THE INVENTION

First Embodiment

Figure 1:
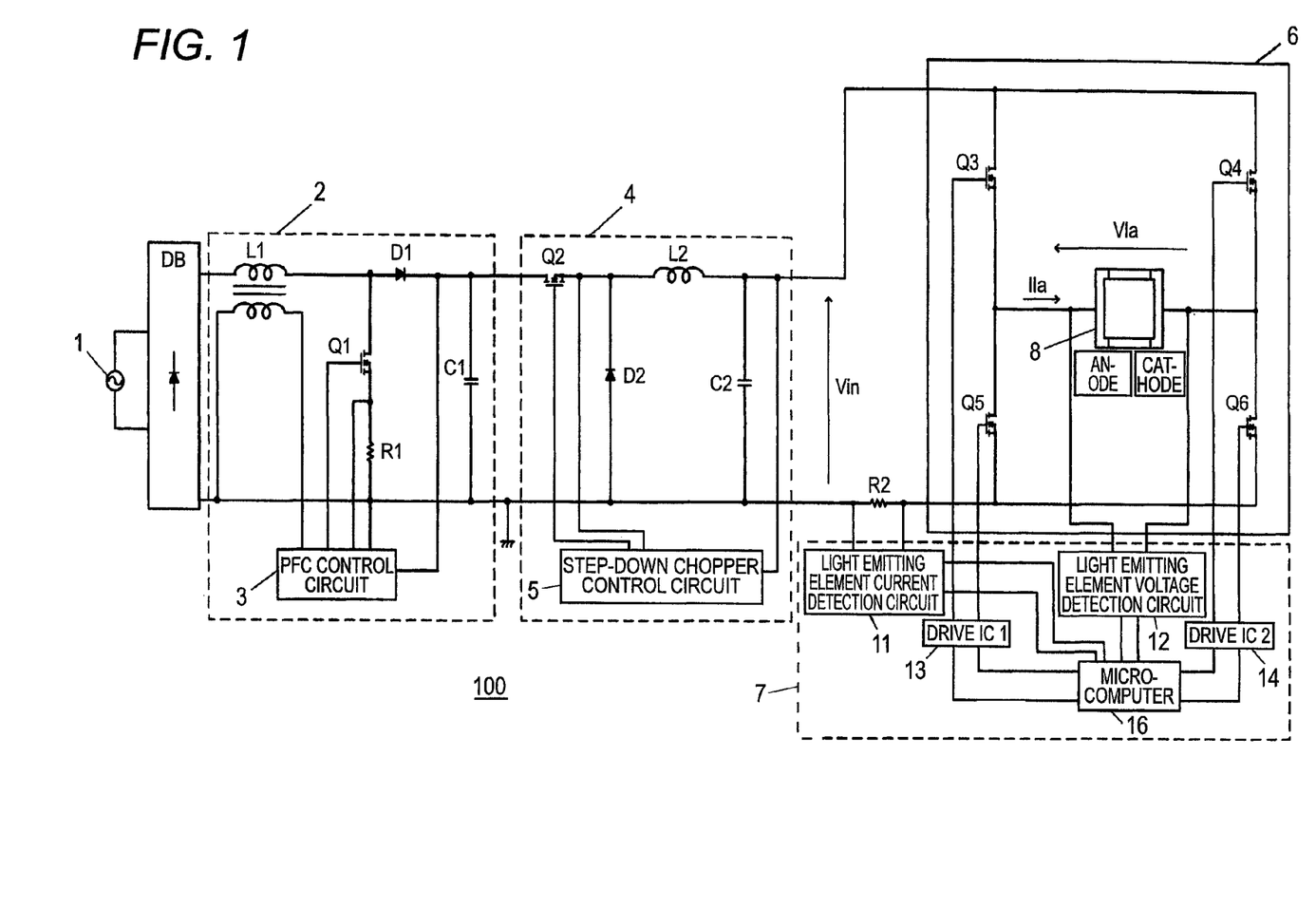
FIG. 1 is a schematic diagram showing a configuration of a light emitting device 100 according to a first embodiment of the present invention.

FIG. 1 is a diagram showing a configuration of a light emitting device 100 according to an embodiment of the present invention. The light emitting device 100 of the present embodiment includes: a power factor correction circuit 2 (hereinafter abbreviated as a "PFC circuit 2") to which current power is supplied from a diode bridge DB configured to rectify an AC power supply 1; a step-down chopper circuit 4 configured to convert a voltage output from the PFC circuit 2 into a voltage supplied to a light emitting element; a forward/reverse inverting circuit 6 configured to switch an electric current supplied to a light emitting element 8; and a light emitting element voltage-current control circuit 7 configured to control a voltage and an electric current of the light emitting element 8. The light emitting element voltage-current control circuit 7 includes a light emitting element current detection circuit 11, a light emitting element voltage detection circuit 12, drive ICs 13 and 14, and a microcomputer 16.

Since the light emitting device 100 of the present embodiment includes the forward/reverse inverting circuit 6 allocated to the light emitting element 8, it is possible to reliably apply a reverse voltage to an abnormal light emitting element 8, to thus let a refresh current flow and restore the abnormal light emitting element 8. The light emitting element voltage detection circuit 12 detects the abnormality in the light emitting element 8 based on only a change in a value of a voltage developed in the light emitting element 8. Hence, the number of components and an object of control can be reduced.

The first embodiment of the present invention is described by reference to FIG. 1. In FIG. 1, reference symbol VIa designates a voltage applied to the light emitting element 8, and IIa designates an electric current flowing into the light emitting element 8. The light emitting element 8 of the first embodiment is an organic electroluminescent panel and includes an anode and a cathode. When an electric current flows from the anode to the cathode, the organic electroluminescent panel emits light.

First, a configuration of the light emitting device is described. The PFC circuit 2 is a circuit configured to convert an AC voltage into a DC voltage. A switching element Q1 of the PFC circuit 2 operates at a voltage of tens of kilohertz to hundreds of kilohertz. Instead of the PFC circuit 2, a circuit system serving as a direct current power supply or a direct current power supply may be used.

The step-down chopper circuit 4 is a circuit configured to convert a DC voltage into a DC voltage. A switching element Q2 of the step-down chopper circuit 4 operates at a voltage of tens of kilohertz to hundreds of kilohertz. Instead of the step-down chopper circuit 4, a circuit system serving as a direct current power supply or a direct current power supply may be used.

Next, operation of the light emitting device is described. In the forward/reverse inverting circuit 6, when the light emitting element 8 is in a normal state, switching elements Q3 and Q6 are controlled in an ON state, and switching elements Q4 and Q5 are controlled in an OFF state. At this time, an electric current flows from the anode of the light emitting element 8 to the cathode thereof, and the light emitting element 8 is illuminated.

When an abnormality occurred in the light emitting element 8, a principal flow of operation includes:

(1) detecting an abnormality in the light emitting element 8;

(2) applying a voltage, which is opposite in a direction to the voltage applied in the normal state, to the light emitting element 8;

(3) determining that the light emitting element 8 is restored to the normality; and (4) applying a normal electric current to the light emitting element 8.

Figure 2:
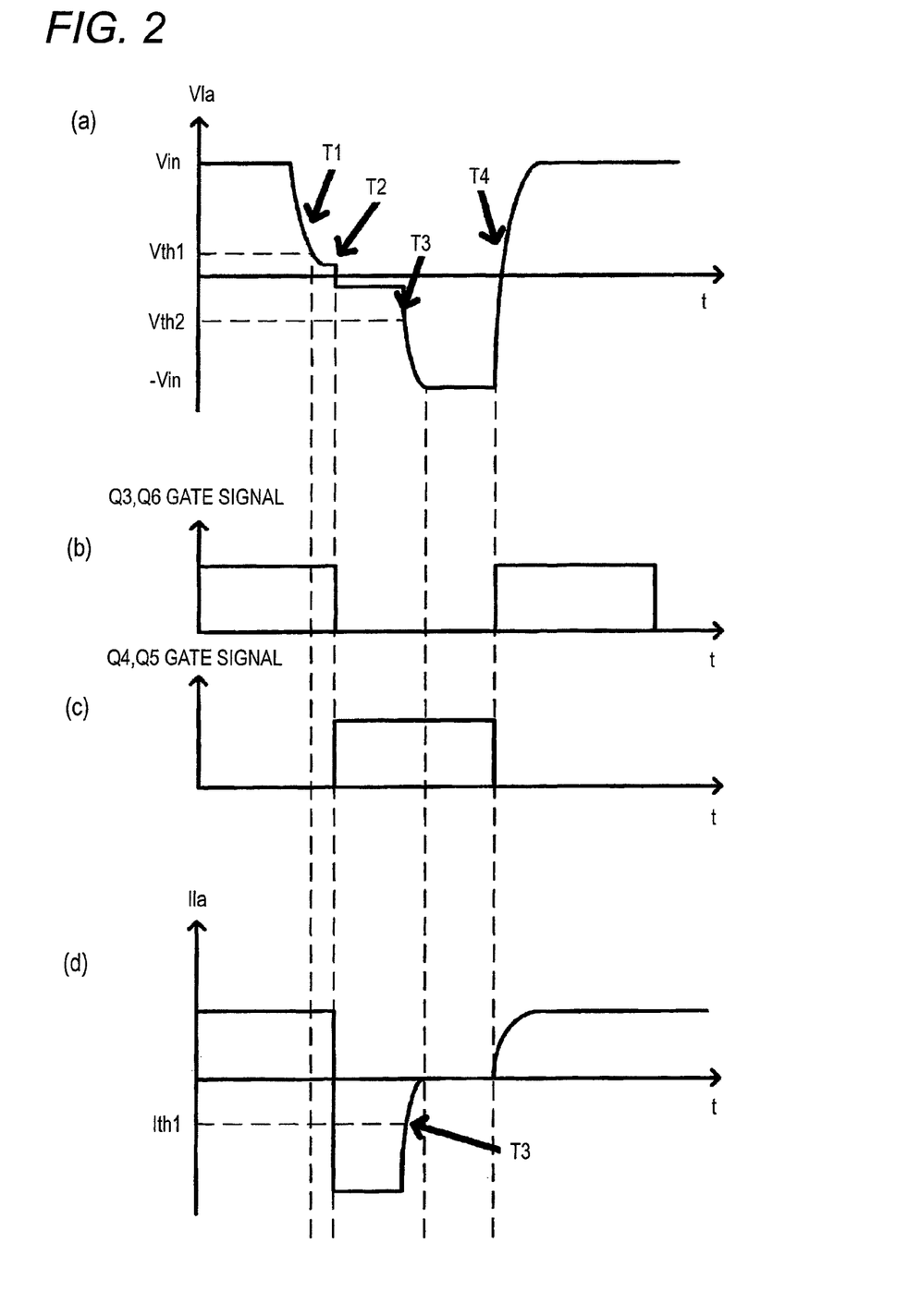
FIG. 2 is a timing chart showing a flow of operation of the light emitting device 100 according to the first embodiment of the present invention.

FIG. 2 shows a timing chart of the operation flow.

(1) Detecting an Abnormality in the Light Emitting Element 8 (T1).

When the light emitting element 8 becomes abnormal, the element mainly becomes short-circuited in many cases. For this reason, the voltage VIa (the voltage applied to the light emitting element) falls. The light emitting element voltage detection circuit 12 detects the fall in voltage VIa and sends a signal to the microcomputer 16.

(2) Applying a Voltage, which is Opposite in a Direction to the Voltage Applied in the Normal State, to the Light Emitting Element 8 (T2).

When the voltage VIa falls to a threshold value Vth1, the microcomputer 16 sends a signal to the drive IC1 (13) and the drive IC2 (14); turns off the switching elements Q3 and Q6, thereby turning on the switching elements Q4 and Q5. Therefore, a voltage that is opposite in a direction the voltage applied in normal state is applied to the light emitting element 8. An electric current (a refresh current) of reverse direction flows in the light emitting element 8.

(3) Determining that the Light Emitting Element 8 is Restored to the Normality (T3).

When restored to the normality, the light emitting element 8 shifts from a short-circuited state to an open state. The voltage VIa accordingly falls to a level −Vin (reference symbol Vin designates a voltage across a step-down chopper output voltage C2). The light emitting element voltage detection circuit 12 detects a fall in voltage VIa and sends a signal to the microcomputer 16. Further, the light emitting element shifts from the short-circuited state to the open state; hence, a value of the current IIa flowing in the light emitting element 8 rises. The light emitting element current detection circuit 11 detects a rise in value of the current IIa and sends a signal to the microcomputer 16.

A condition for detecting restoration of the light emitting element 8 may be any one of the following three conditions (see FIG. 2).

i) when the voltage VIa falls to a threshold value Vth2 or below;

ii) when the current IIa rises to a threshold value Ith1 or more; and iii) when the conditions i) and ii) are fulfilled.

(4) Applying a Normal Electric Current to the Light Emitting Element 8 (T4).

When the voltage VIa falls to the threshold value Vth2 (or when the electric current IIa has increased to or more the threshold value Ith1), the microcomputer 16 sends a signal to the drive IC1 (13) and the drive IC2 (14), thereby turning on the switching elements Q3 and Q6 and turning off the switching elements Q4 and Q5. For this reason, an electric current flows into the light emitting element 8 in the same direction in which the electric current flows in normal state. Accordingly, the light emitting element 8 emits light.

As mentioned above, the light emitting device 100 of the present embodiment includes a forward/reverse inverting circuit 6 allocated to the light emitting element 8. Thus, a reverse voltage is thereby reliably applied to the abnormal light emitting element 8 so as to let the refresh current flow in the light emitting element, so that the light emitting element 8 can be restored.

When the abnormal light emitting element 8 is properly restored, the light emitting element 8 can again be illuminated, hence the life of the light emitting element 8 can be prolonged. Moreover, the light emitting element voltage detection circuit 12 or the light emitting element current detection circuit 11 can determine whether the light emitting element 8 is restored to normal based on only a change in the value of the voltage or the electric current in the light emitting element 8. Accordingly, the number of components and the number of objects to be controlled can be reduced.

Second Embodiment

Figure 3:
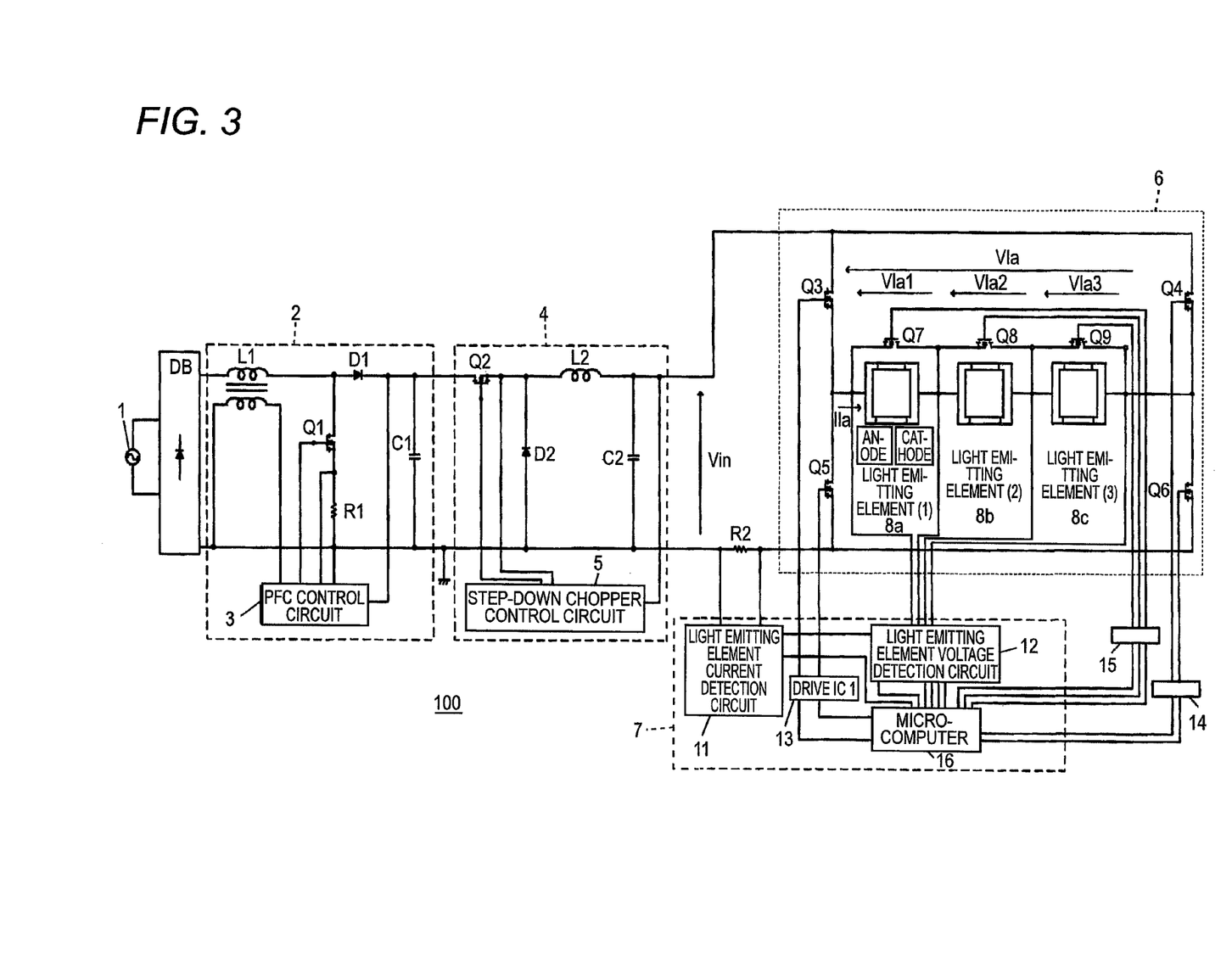
FIG. 3 is a schematic diagram showing a configuration of the light emitting device 100 according to a second embodiment of the present invention.

FIG. 3 is a diagram showing a configuration of the light emitting device 100 according to a second embodiment of the present invention. In the drawing, reference symbol VIa designates a voltage applied to all light emitting elements 8a, 8b, and 8c; VIa1 designates a voltage applied to the light emitting element 8a; VIa2 designates a voltage applied to the light emitting element 8b; and VIa3 designates a voltage applied to the light emitting element 8c. Further, reference symbol IIa designates an electric current flowing in the light emitting elements 8a, 8b, and 8c.

Even in the present embodiment, each of the light emitting elements 8a, 8b, and 8c is an organic electroluminescent panel as in the case of the first embodiment. Each of the light emitting elements 8a, 8b, and 8c includes a set of an anode and a cathode. The PFC circuit 2 has the same configuration as that in the first embodiment. The step-down chopper circuit 4 also has the same configuration as that in the first embodiment. In the forward/reverse inverting circuit 6, one FET (Q7) is connected in parallel to the light emitting element 8a; another FET (Q8) is connected in parallel to the light emitting element 8b; and still another FET (Q9) is connected in parallel to the light emitting element 8c.

Next, operation of the light emitting device is described. When all of the light emitting elements 8a, 8b, and 8c are in a normal state, the switching elements Q3 and Q6 are controlled in the ON state, and the switching elements Q4 and Q5 are controlled in the OFF state. At this time, the electric current follows from the anodes to the cathodes in the respective light emitting elements 8a, 8b, and 8c, and the light emitting elements 8a, 8b, and 8c are illuminated. The light emitting elements 8a, 8b, and 8c exhibit a characteristic of no electric current flowing even when a voltage of reverse direction is applied to the normal light emitting elements 8a, 8b, and 8c and an electric current flowing when the voltage of reverse direction is applied to the light emitting elements 8a, 8b, and 8c in which an abnormality occurred.

When an abnormality occurred in the light emitting element (e.g., 8a), a principal flow of operation includes (1) detecting an abnormality in the light emitting element 8a;

(2) identifying the abnormal light emitting element 8a;

(3) applying a voltage, which is opposite in a direction to the voltage flowing in a normal state, to the abnormal light emitting element 8a, and controlling the other normal light emitting elements 8b and 8c by turning on the FETs Q8 and Q9 connected in parallel to the respective elements 8b and 8c such that a reverse voltage is not applied to the respective normal light emitting elements 8b and 8c;

(4) detecting that the abnormal light emitting element 8a is restored to the normal state; and (5) applying a normal electric current to the light emitting element 8a (8b, 8c).

Figure 4:
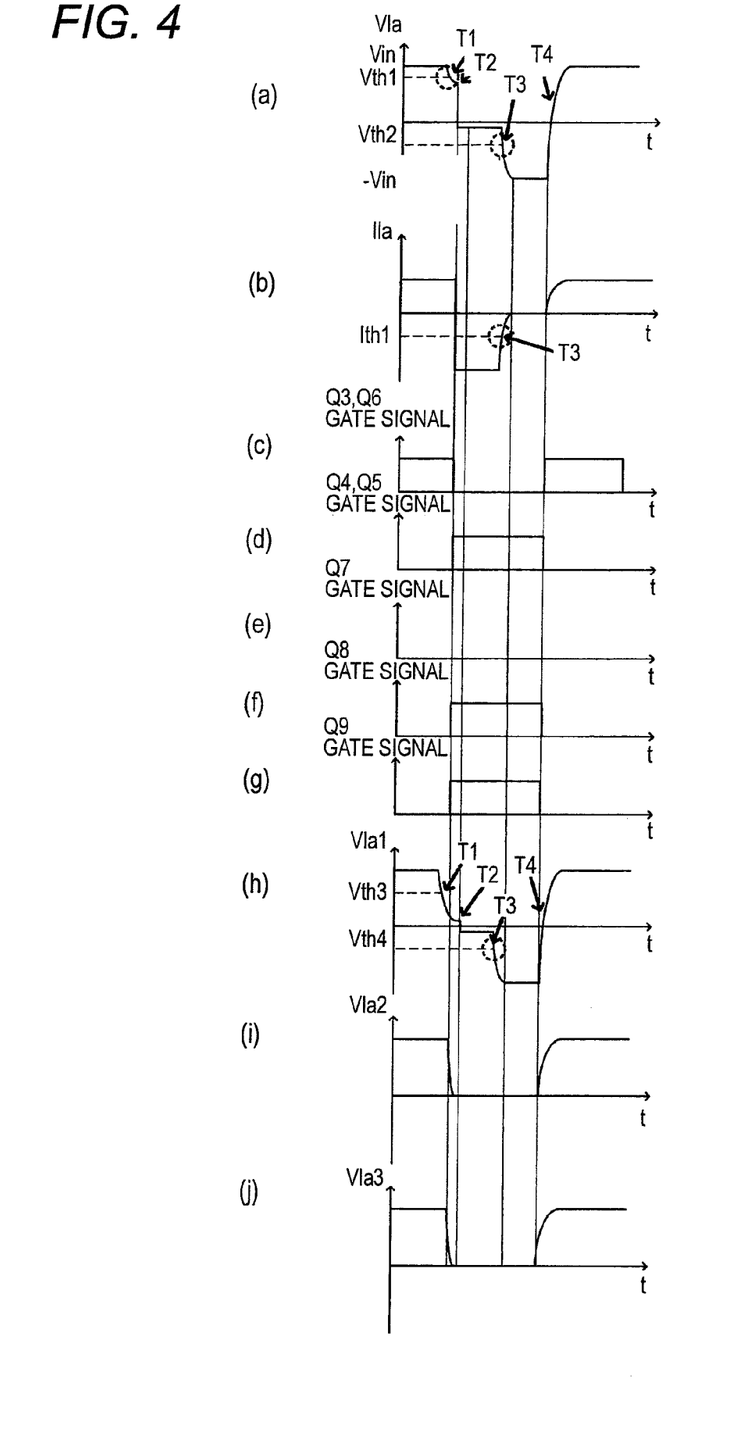
FIG. 4 is a timing chart showing a flow of operation of the light emitting device 100 according to the second embodiment of the present invention.

FIG. 4 shows a timing chart of the operation flow. The timing chart shown in FIG. 4 and the following descriptions are provided on assumption that an abnormality occurred in the light emitting element 8a.

(1) Detecting an Abnormality in the Light Emitting Element 8a.

When the light emitting element 8a becomes abnormal, the element mainly becomes short-circuited in many cases. For this reason, the voltage applied to the light emitting element 8a falls. In the second embodiment, since the abnormality occurred in the light emitting element 8a, the voltages VIa and VIa1 fall. The light emitting element voltage detection circuit 12 detects the fall in the voltages VIa and VIa1 and sends a signal to the microcomputer 16.

A condition for determining that the light emitting element 8a is restored to the normal state may be any one of the three conditions as follows:

i) when the voltage VIa falls to the threshold value Vth1 or below;

ii) when the voltage VIa1 falls to a threshold value Vth3 or below; and iii) when the conditions i) and ii) are fulfilled.

(2) Identifying the Abnormal Light Emitting Element 8a.

In the case of a normal light emitting element, no change occurs in a voltage applied across the light emitting element, so long as a constant electric current flows through the element. In the second embodiment, since the voltage VIa1 applied to the light emitting element 8a falls, the microcomputer 16 determines, based on the signal sent from the light emitting element voltage detection circuit 12, that the abnormality occurs in the light emitting element 8a.

(3) Applying a Voltage, which is Opposite in a Direction to the Voltage Applied in the Normal State, to the Light Emitting Element 8a in which the Abnormality Occurred; and No Voltage is Applied to the Normal Light Emitting Elements 8b and 8c.

The abnormal light emitting element 8a is identified in step (2). As mentioned previously, the normal light emitting elements 8b and 8c have the characteristic in which no current flows when a voltage of reverse direction is applied to the light emitting elements 8b and 8c, and the abnormal light emitting element 8a has the characteristic in which the electric current flows when the voltage of reverse direction is applied to the light emitting element 8a. Accordingly, in order to let an electric current of reverse direction (the refresh current) flow into the light emitting element 8a in which an abnormality occurred, the microcomputer 16 inputs a gate signal to the FETs (Q8 and Q9) connected in parallel to the respective normal light emitting elements 8b and 8c.

In the second embodiment, the abnormality occurs in the light emitting element 8a. Hence, the microcomputer 16 inputs a signal to the drive IC3 (15) and a gate signal to the switching elements Q8 and Q9, thereby shorting the light emitting elements 8b and 8c. Concurrently, the switching elements Q3 and Q6 are turned off, and the switching elements Q4 and Q5 are turned on. As a consequence, a voltage of reverse direction is applied to the light emitting element 8a.

Consequently, the electric current flows along a path of the switching elements Q4, Q9, Q8, the light emitting element 8a, and the switching element Q5. Therefore, the current of reverse direction (the refresh current) flows solely into a panel in which an abnormality occurred, and the voltage of reverse direction is not applied to the remaining normal light emitting elements 8b and 8c.

(4) Determining that the Light Emitting Element 8a is Restored to the Normal State.

When being restored to the normal state, the light emitting element 8a shifts from a short-circuited state to an open state. The voltage VIa accordingly falls to a level −Vin (reference symbol Vin designates a voltage developing across the step-down chopper output voltage C2). The light emitting element voltage detection circuit 12 detects a fall in voltage VIa and sends a signal to the microcomputer 16. The voltage VIa1 also falls to the value of −Vin. Further, the light emitting element shifts from the short-circuited state to the open state; hence, a value of the current IIa flowing into the light emitting element 8a rises. The light emitting element current detection circuit 11 detects a rise in value of the current IIa and sends a signal to the microcomputer 16.

A condition for determining that the light emitting element 8a is restored (see FIG. 4) may be any one of the five conditions as follows:

i) when the voltage VIa falls to a threshold value Vth2 or below;

ii) when the voltage VIa1 falls to the threshold value Vth4 or below;

iii) when the current IIa has risen to the threshold value Ith1 or more;

iv) when two of the conditions i), ii), and iii) are fulfilled; and v) when all of the three conditions i), ii), and iii) are fulfilled.

(5) Applying a Normal Electric Current to the Light Emitting Element 8a.

When any of the conditions i) to v) described in step (4) is fulfilled, the microcomputer 16 sends a signal to the drives IC1 (13) and IC2 (14), to thus turn on the switching elements Q3 and Q6 and turn off the switching elements Q4 and Q5. The microcomputer 16 inputs a gate signal to the switching elements Q8 and Q9 in step (3) but stops the signal. For this reason, the electric current flows into the light emitting elements 8b and 8c in the same direction in which the electric current flows in the normal state, whereupon the light emitting elements 8a, 8b, and 8c emit light.

As mentioned above, the light emitting device 100 of the present embodiment includes: the forward/reverse inverting circuit 6 allocated to the light emitting elements 8a, 8b, and 8c; and the shorting switches Q7, Q8, and Q9 provided respectively for the light emitting elements 8a, 8b, and 8c. A reverse voltage can reliably be applied to the abnormal light emitting element 8a, whiles the normal light emitting elements 8b and 8c can avoid application of the reverse voltage. Thus, the abnormal light emitting element 8a can be restored.

Each of the shorting switches Q7, Q8, and Q9 include a field effect transistor (FET) capable of operating at high speed. Application of the reverse voltage to the normal light emitting elements 8b and 8c can be avoided at high speed, and imposing stress to the normal light emitting elements 8b and 8c can be avoided.

Third Embodiment

Figure 5:
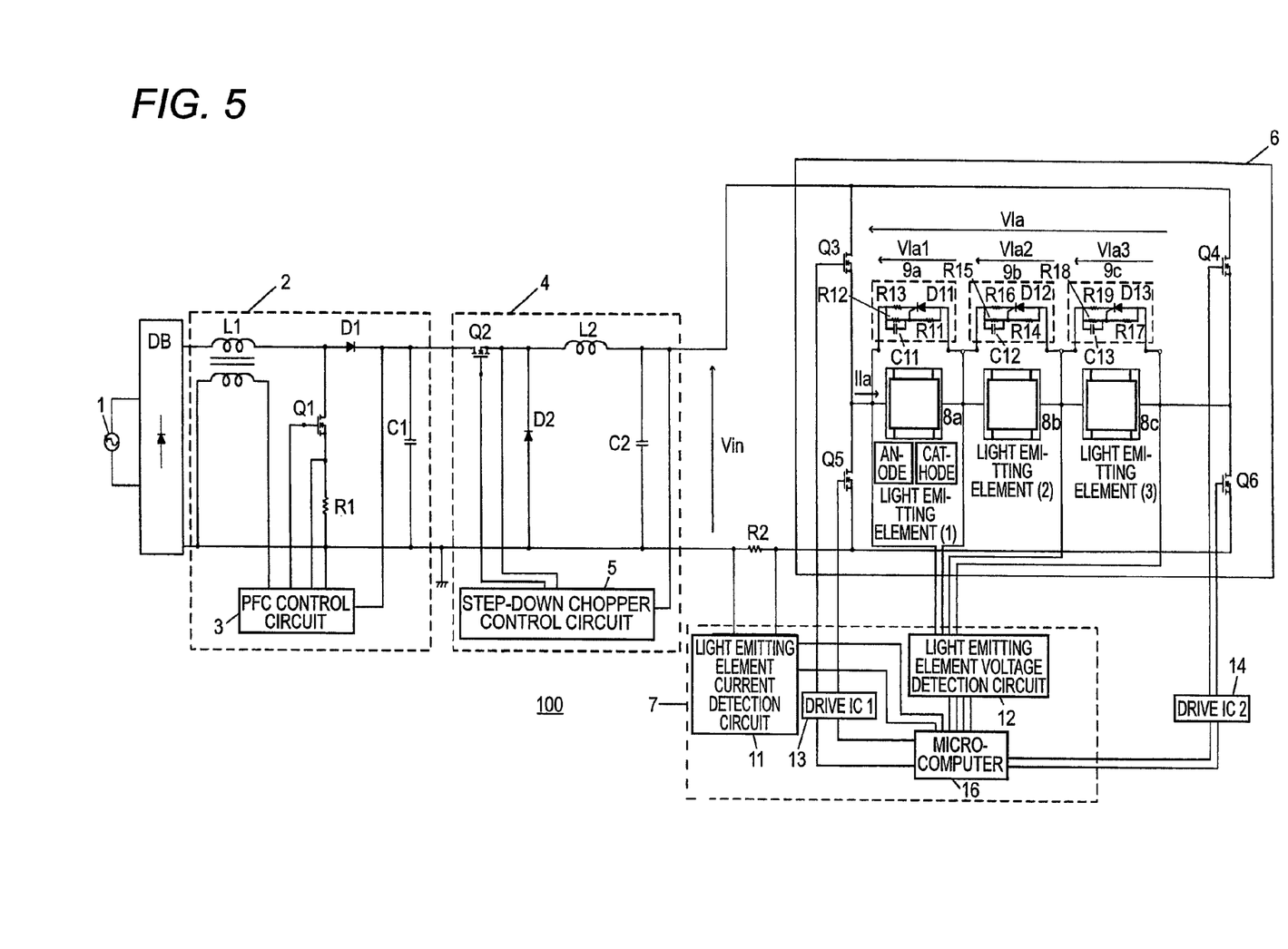
FIG. 5 is a schematic diagram showing a configuration of the light emitting device 100 according to a third embodiment of the present invention.

FIG. 5 is a diagram showing a configuration of the light emitting device 100 according to a third embodiment of the present invention. In the drawing, reference symbol VIa designates a voltage applied to all of the light emitting elements

8a, 8b, and 8c; VIa1 designates a voltage applied to the light emitting element 8a; VIa2 designates a voltage applied to the light emitting element 8b; and VIa3 designates a voltage applied to the light emitting element 8c. Further, reference symbol IIa designates an electric current flowing into the light emitting elements 8a, 8b, and 8c. As in the first embodiment, the light emitting elements 8a, 8b, and 8c each are an organic electroluminescent panel, and each of the light emitting elements 8a, 8b, and 8c includes a set of an anode and a cathode.

Figure 8:
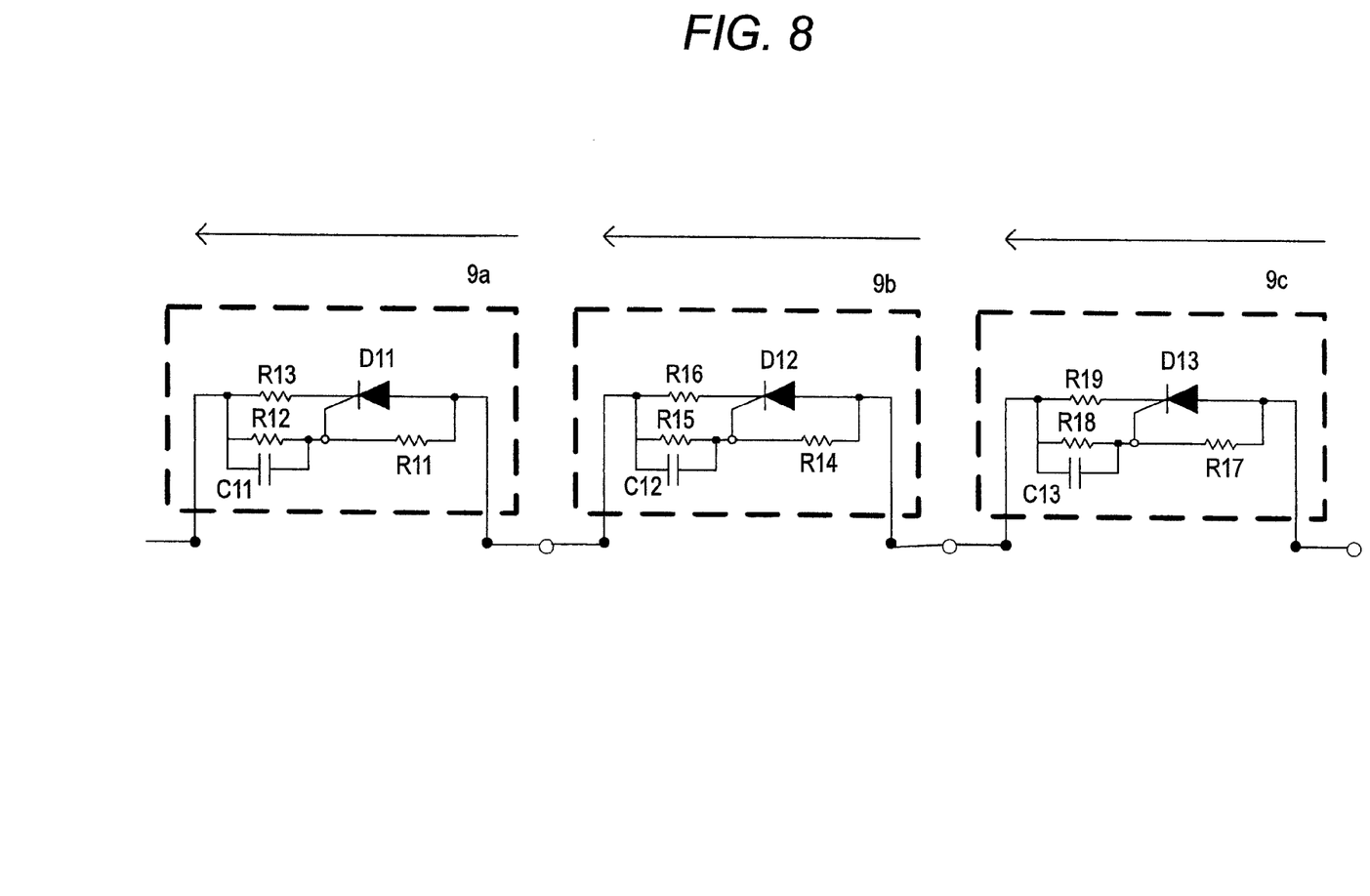
FIG. 8 is an enlarged view of a main portion shown in FIG. 5.

First, a configuration of the light emitting device is described. The PFC circuit 2 has the same configuration as that in the first embodiment. Also, the step-down chopper circuit 4 has the same configuration as that in the first embodiment. In the forward/reverse inverting circuit 6, an abnormal short circuit 9a is connected in parallel to the light emitting element 8a; another abnormal short circuit 9b is connected in parallel to the light emitting element 8b; and yet another abnormal short circuit 9c is connected in parallel to the light emitting element 8c. The abnormal short circuit 9a has resistors R11, R12, R13, a capacitor C11, and a thyristor D11. The abnormal short circuit 9b includes resistors R14, R15, R16 a capacitor C12, and a thyristor D12. The abnormal short circuit 9c includes resistors R17, R18, R19, a capacitor C13, and a thyristor D13 (see FIGS. 5 and 8, wherein FIG. 8 is an enlarged view of the main portion shown in FIG. 5).

Next, operation of the light emitting device is described. When all of the light emitting elements 8a, 8b, and 8c are in the normal state, the switching elements Q3 and Q6 are controlled in the ON state, and the switching elements Q4 and Q5 are controlled in the OFF state. At this time, the electric current flows from the anodes to the cathodes in the respective light emitting elements 8a, 8b, and 8c, and the light emitting elements 8a, 8b, and 8c are illuminated.

When an abnormality occurs in the light emitting element (e.g., 8a), a principal flow of operation is as follows.

(1) Detecting an abnormality in the light emitting element 8a.

(2) Applying a voltage, which is opposite in a direction to the voltage flowing in the normal state, to the light emitting element 8a. As a result, an electric current of reverse direction (a refresh current) flows in the light emitting element 8a in which the abnormality occurred. Further, the abnormal short circuits 9b and 9c connected in parallel to the respective normal elements 8b and 8c except the abnormal light emitting element 8a operate, whereby the light emitting elements 8b and 8c become shorted such that the reverse voltage is not applied to the normal light emitting elements 8b and 8c.

(3) Determining that the abnormal light emitting element 8a is restored to the normal state.

(4) Applying a normal electric current to the light emitting elements 8a, 8b, and 8c.

Figure 6:
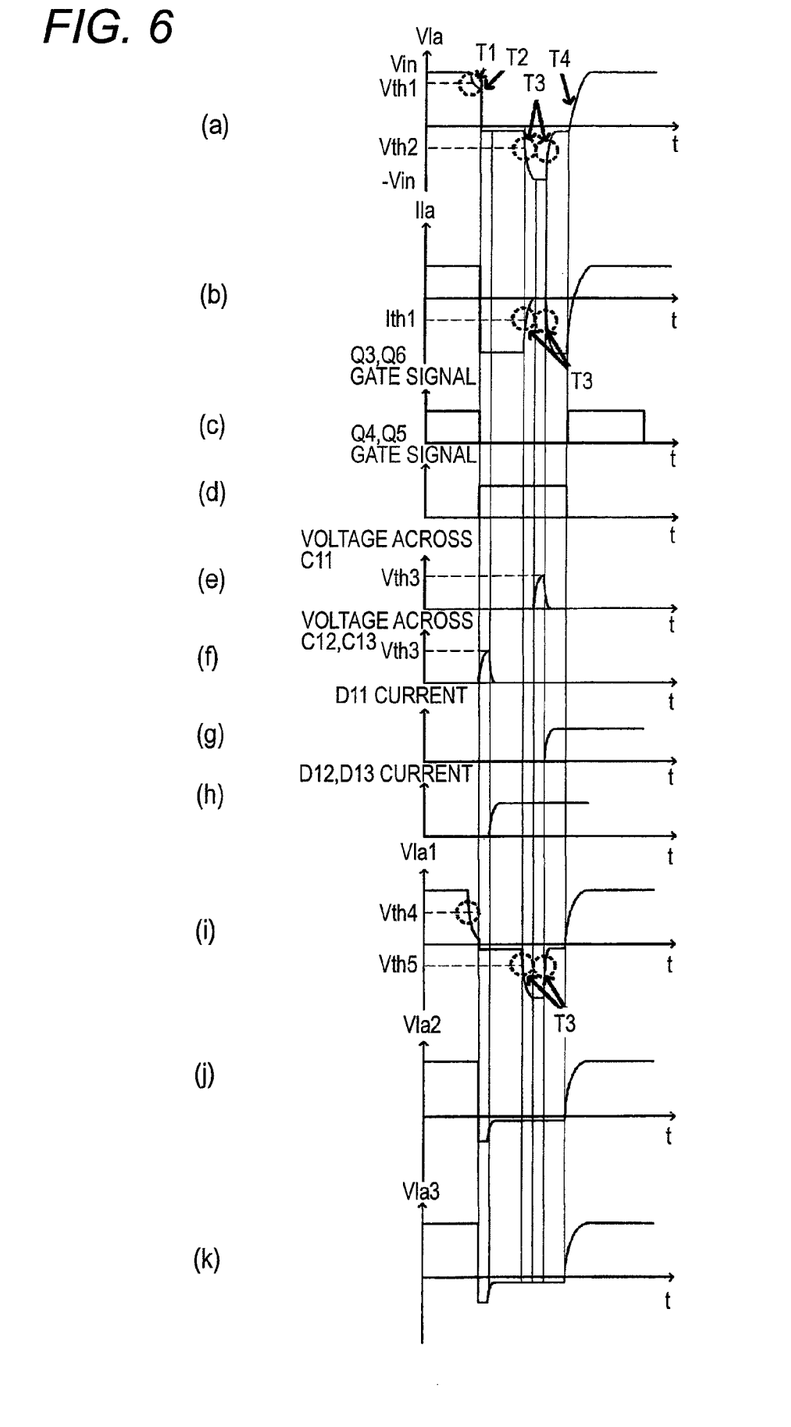
FIG. 6 is a timing chart showing a flow of operation of the light emitting device 100 according to the third embodiment of the present invention.

FIG. 6 shows a timing chart of operation. The timing chart shown in FIG. 6 and the following descriptions are based on the assumption that an abnormality occurred in the light emitting element 8a.

(1) Detecting an Abnormality in the Light Emitting Element 8a (T1).

When the light emitting element 8a becomes abnormal, the element mainly becomes shorted in many cases. For this reason, the voltage applied to the light emitting element 8a falls. In the third embodiment, since an abnormality occurs in the light emitting element 8a, the voltages VIa and VIa1 fall. The light emitting element voltage detection circuit 12 detects a fall in the voltages VIa and VIa1 and sends a signal to the microcomputer 16.

A condition for determining that the light emitting element 8 is restored to the normal state may be any one of the three conditions as follows:

i) when the voltage VIa falls to the threshold value Vth1 or below;

ii) when the voltage VIa1 falls to a threshold value Ith1 or below; and iii) when both the condition i) and the condition ii) are fulfilled.

(2) When the Voltage of Reverse Direction is Applied to the Light Emitting Element 8a, the Abnormal Short Circuits 9b and 9c Connected in Parallel to The Respective Normal Light Emitting Elements 8b and 8c Operate. As a Consequence, the Normal Light Emitting Elements 8b and 8c Become Shorted (T2).

When the abnormality in the light emitting element 8a is detected in step (1), the microcomputer 16 inputs a signal to the drives IC1 (13) and IC2 (14), to thus turn off the switching elements Q3 and Q6 and turn on the switching elements Q4 and Q5 and apply a voltage of reverse direction to the light emitting element 8a.

The normal light emitting elements 8b and 8c have the characteristic in which no current flows when a voltage of reverse direction is applied to the light emitting elements, and the abnormal light emitting element 8a has the characteristic in which the electric current flows when the voltage of reverse direction is applied to the abnormal light emitting element 8a. Since the abnormality occurs in the light emitting element 8a, the switching elements Q3 and Q6 are turned off, and the switching elements Q4 and Q5 are turned on, whereby the electric current flows along a path of the switching element Q4, the abnormal short circuit 9c, the abnormal short circuit 9b, the light emitting element 8a, and the switching element Q5.

Operation of the abnormal short circuits 9a, 9b, and 9c is now described. Here, the abnormal short circuit 9c is described as an example. In a state in which the switching elements Q3 and Q6 of the forward/reverse inverting circuit 6 shown in FIG. 5 are controlled in an OFF state and in which the switching elements Q4 and Q5 of the forward/reverse inverting circuit 6 are controlled in an ON state, the electric current flows in sequence of R17 to C13 and R18. Therefore, a voltage developing across the capacitor C13 rises. Since a voltage is applied to the thyristor D13 such that a forward current flow from the anode to the cathode, the thyristor D13 is turned on when the voltage developing across the capacitor C13 comes to a certain value or more.

Since the thyristor D12 in the abnormal short circuit 9b is also turned on according to the same principle, the normal light emitting elements 9b and 9c are shorted. From the above, when a reverse voltage is applied to the light emitting element 8a by turning off the switching elements Q3 and Q6 and turning on the switching elements Q4 and Q5, the voltage is not applied to the normal light emitting elements 8b and 8c, whereas the voltage is applied to the light emitting element 8a in which the abnormality occurred, so that the electric current flows in a reverse direction.

(3) Determining that the Abnormal Light Emitting Element 8a is Restored to the Normal State (T3).

When being restored to the normal state, the light emitting element 8a shifts from the short-circuited state to the open state. As a result, the electric current of reverse direction does not flow into the light emitting element 8a but flows into the abnormal short circuit 9a. At this time, the voltages VIa and VIa1 fall, whilst the electric current IIa rises. In the meantime, the electric current flows into the abnormal short circuit 9a, and the voltage developing across the capacitor C11 rises by way of the resistor R11. When the voltage developing across the capacitor C11 comes to the threshold value Vth3 or more, the thyristor D11 is turned on; therefore, the voltages VIa and VIa1 rise, whereas the electric current IIa falls.

A condition under which the light emitting element voltage detection circuit 12 and the light emitting element current detection circuit 11 determines that the light emitting element 8a is restored (see FIG. 6) may be any one of the following conditions i) to x).

In case in which the thyristor D11 is not yet turned on after the light emitting element 8a is restored, any one of conditions as follows:

i) when the voltage VIa falls to the threshold value Vth2 or below;
ii) when the voltage VIa1 falls to the threshold value Vth5 or below;
iii) when the current IIa rises to the threshold value Ith1 or more;
iv) when two of the conditions i), ii), and iii) are fulfilled; and
v) when all of the three conditions i), ii), and iii) are fulfilled.

In case in which the thyristor D11 is in an ON state after the light emitting element 8a is restored, any one of conditions as follows:

vi) when the voltage VIa rises to the threshold value Vth2 or more;
vii) when the voltage VIa1 rises to the threshold value Vth5 or more;
viii) when the electric current IIa falls to the threshold value Ith1 or below;
ix) when any two of the conditions vi), vii), and viii) are fulfilled; and
x) when all of the three conditions vi), vii), and viii) are fulfilled.

(4) Applying a Normal Electric Current to the Light Emitting Element 8a (T4).

When any one of the conditions i) to x) described in step (3) is fulfilled, the microcomputer 16 sends a signal to the drive IC1 (13) and the drive IC2 (14), thereby performing control so as to turn on the switching elements Q3 and Q6 and turn off the switching elements Q4 and Q5. The electric current flows in the light emitting elements 8a, 8b, and 8c in the same direction in which the electric current flows in normal state, whereby the light emitting elements 8a, 8b, and 8c emit light.

The light emitting device 100 of the present embodiment includes: the forward/reverse inverting circuit 6 that is allocated to the light emitting elements 8a, 8b, and 8c; and the abnormal short circuits 9a, 9b, and 9c provided respectively for the light emitting elements 8a, 8b, and 8c. A reverse voltage is reliably applied to the abnormal light emitting element 8a, whereas application of the reverse voltage to the normal light emitting elements 8b and 8c can be avoided, so that the abnormal light emitting element 8a can be restored.

When the reverse voltage is applied to the light emitting element 8a having become abnormal, the thyristors D12 and D13 conduct, thereby protecting the normal light emitting elements 8b and 8c. Accordingly, drive ICs for driving the thyristors D11 and D12 become obviated, so that the configuration of the light emitting device 100 can be simplified.

The organic electroluminescent element serving as the light emitting element used in the embodiment of the present invention is now described.

Figure 7:
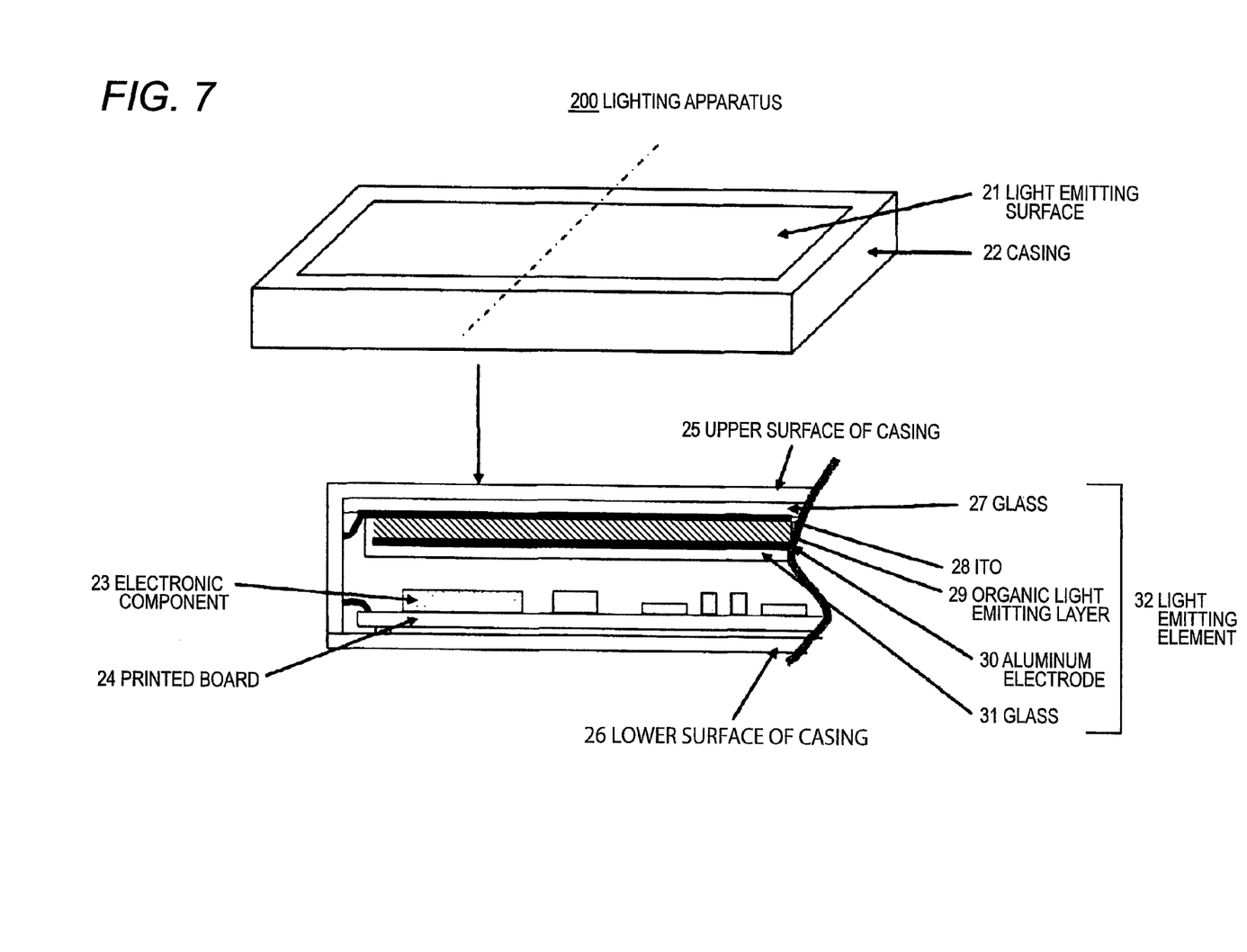
FIG. 7 is a schematic diagram showing a configuration of an organic electroluminescent lighting apparatus 200 according to a fourth embodiment of the present invention.

FIG. 7 is a view for describing a general configuration of a lighting apparatus 200 using the organic electroluminescent element employed in the embodiment of the present invention. The lighting apparatus 200 includes: a light emitting elements 32 including an organic light emitting layer 29, a transparent electrode ITO 28 configured to supply electric power to the light emitting layer, an aluminum electrode 30, which are sandwiched between glass 27 and 31 for protection; an electronic component 23 for supplying electric power to the light emitting element 32; and a printed board 24. The lighting apparatus 200 is housed in a casing 22. Reference numeral 21 designates a light emitting surface; 25 designates an upper surface of the casing; and 26 designates a lower surface of the casing. A lighting circuit including any of the forward/reverse inverting circuits of the light emitting devices described in the first through third embodiments includes a feeding section (omitted from the drawings) that supplies electric power, the electronic component 23, and a printed board 24.

When an abnormality occurred in any of the light emitting elements provided in the organic electroluminescent lighting apparatus 200, the configuration makes it possible to reliably apply a reverse voltage to the abnormal light emitting element to let the refresh current flow in the abnormal light emitting device, thereby enabling restoration of the abnormal light emitting element and avoiding infliction of stress on the normal light emitting elements.

In the embodiments, the organic electroluminescent element is used as the light emitting elements. However, it is a matter of course that the lighting element is not limited to the organic electroluminescent element and may be applied to other elements which can be refreshed by repairing an insulation failure, such as an element configured to emit light by application of a voltage between electrodes, e.g., an inorganic electroluminescent element, an LED, etc.

The present patent application is based on Japanese Patent Application (Application No. 2008-080241) filed on Mar. 26, 2008, the entire subject matter of which is incorporated herein by reference.

INDUSTRIAL APPLICABILITY

The present invention is applicable to an organic electroluminescent light emitting device and a lighting apparatus capable of applying a reverse voltage to the abnormal light emitting element reliably such that a refresh current flows in the abnormal light emitting element, thereby restoring the abnormal light emitting element and avoiding stress on a normal light emitting element.

The invention claimed is:

1. A light emitting device comprising:
   a plurality of light emitting elements configured to emit light when a direct current is supplied thereto;
   a direct current power supply circuit configured to supply an electric current of a given level or more to the light emitting elements;
   a light emitting element voltage detection circuit configured to detect a voltage applied to the light emitting elements; and
   a forward/reverse inverting circuit configured, when the light emitting element voltage detection circuit detects an abnormality in a light emitting element, to apply a reverse voltage to the light emitting element in which the abnormality is detected.

2. The light emitting device according to claim 1, wherein the forward/reverse inverting circuit includes a shorting switch configured to short a normal light emitting element when the reverse voltage is applied to the light emitting element in which the abnormality is detected.

3. The light emitting device according to claim 2,
wherein the light emitting elements are connected in series,
wherein the shorting switches are connected in parallel with the light emitting elements, respectively, and
wherein the light emitting element voltage detection circuit detects a voltage applied to each of the light emitting elements, and detects an abnormality in the light emitting element based on a change in a value of the voltage.

4. The light emitting device according to claim 1,
wherein the forward/reverse inverting circuit includes a light emitting element current detection circuit configured to detect an electric current flowing in the light emitting elements.

5. The light emitting device according to claim 1,
wherein the forward/reverse inverting circuit includes:
  first and second switching elements which are connected in series to a power supply and a series connection point of which is connected to one end of the light emitting elements; and
  third and fourth switching elements which are connected in series to the power supply and a series connection point of which is connected to the other end of the one or more light emitting elements, and
wherein the second and third switching elements are turned on such that a reverse voltage is applied to the light emitting element in which the abnormality is detected so as to refresh the abnormal light emitting element, and the first and fourth switching elements are turned on such that a forward voltage is applied to the refreshed light emitting element.

6. The light emitting device according to claim 2,
wherein the forward/reverse inverting circuit includes:
  first and second switching elements which are connected in series to a power supply and a series connection point of which is connected to one end of the light emitting elements; and
  third and fourth switching elements which are connected in series to the power supply and a series connection point of which is connected to the other end of the one or more light emitting elements, and
wherein the second and third switching elements are turned on such that a reverse voltage is applied to the light emitting element in which the abnormality is detected so as to refresh the abnormal light emitting element, and the first and fourth switching elements are turned on such that a forward voltage is applied to the refreshed light emitting element.

\* \* \* \* \*